US006815224B2

(12) United States Patent
Bachhofer et al.

(10) Patent No.: US 6,815,224 B2
(45) Date of Patent: Nov. 9, 2004

(54) LOW-TEMPERATURE PROCESSING OF A FERROELECTRIC STRONTIUM BISMUTH TANTALATE LAYER, AND FABRICATION OF FERROELECTRIC COMPONENTS USING THE LAYER

(75) Inventors: Harald Bachhofer, München (DE); Thomas Haneder, Dachau (DE); Oswald Spindler, Vaterstetten (DE); Rainer Waser, Aachen (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/372,983

(22) Filed: Feb. 24, 2003

(65) Prior Publication Data

US 2003/0155597 A1 Aug. 21, 2003

Related U.S. Application Data

(63) Continuation of application No. PCT/DE01/03160, filed on Aug. 14, 2001.

(30) Foreign Application Priority Data

Aug. 24, 2000 (DE) .......................... 100 41 699

(51) Int. Cl.[7] .............................................. H01L 21/00
(52) U.S. Cl. ........................................ 438/3; 257/295
(58) Field of Search ................ 438/3; 257/295, 257/E43.004

(56) References Cited

U.S. PATENT DOCUMENTS

| 5,508,226 A | 4/1996 | Ito et al. |
| 5,708,302 A | 1/1998 | Azuma et al. |
| 5,803,961 A | 9/1998 | Azuma et al. |
| 5,833,745 A | 11/1998 | Atsuki et al. |
| 5,943,111 A | 8/1999 | McMillan |
| 6,072,207 A | 6/2000 | Yoshimori et al. |
| 6,104,049 A | 8/2000 | Solayappan et al. |

FOREIGN PATENT DOCUMENTS

| EP | 0 766 292 A2 | 4/1997 |
| EP | 0 905 277 A1 | 3/1999 |
| EP | 0 910 120 A2 | 4/1999 |
| WO | WO 94/10702 | 5/1994 |
| WO | WO 98/39801 | 9/1998 |
| WO | WO 00/42645 | 7/2000 |

OTHER PUBLICATIONS

Nagashima, K. et al.: "Characteristics of Metal/Ferroelectric/Insulator/Semiconductor Structure Using $SrBi_2Ta_2O_9$ as the Ferroelectric Material", Japanese Journal of Applied Physics, Publication Office Japanese Journal of Applied Physics, Tokyo, Japan, vol. 35, Part 2, No. 12B, Dec. 15, 1996, pp. L1680–L1682, date: unknown.

Bachhofer, H. et al.: "Effect of Film Composition on Low Temperature Processing of SBT Deposited by MOCVD", Mat.Res.Soc.Symp.Proc., Ferroelectric Thin Films VIII, pp. 1–6.

*Primary Examiner*—George Fourson
*Assistant Examiner*—Fernando L. Toledo
(74) *Attorney, Agent, or Firm*—Laurence A. Greenberg; Werner H. Stemer; Gregory L. Mayback

(57) ABSTRACT

In a method for producing ferroelectric strontium bismuth tantalate having the composition $Sr_xBi_yTa_2O_9$ (SBT) or $Sr_xBi_y(Ta, Nb)_2O_9$ (SBTN), the element strontium, which is normally present in an amount y=2, is provided in excess in a range from $2.1 \leq y \leq 3.0$. This makes it possible to carry out the heat treatment step for converting the deposited material into the ferroelectric phase at a temperature $T_1$, which is lower than 700° C. In addition, the strontium content x can be reduced from a nominal value of 1 to 0.7.

12 Claims, 2 Drawing Sheets

LOW-TEMPERATURE PROCESSING OF A FERROELECTRIC STRONTIUM BISMUTH TANTALATE LAYER, AND FABRICATION OF FERROELECTRIC COMPONENTS USING THE LAYER

CROSS-REFERENCE TO RELATED APPLICATION

This application is a continuation of copending International Application No. PCT/DE01/03160, filed Aug. 14, 2001, which designated the United States and was not published in English.

BACKGROUND OF THE INVENTION

Field of the Invention

The invention relates to a method for producing ferroelectric strontium bismuth tantalate (SBT), to a method for fabricating a ferroelectric storage capacitor which includes a ferroelectric SBT layer of this type, to a semiconductor memory which includes the storage capacitor, and to a method for fabricating a semiconductor transistor which includes a ferroelectric SBT layer. In the strontium bismuth tantalate material, the tantalum content can be at least partially replaced by the element niobium.

In the semiconductor industry, in particular the silicon industry, it is now known to use ferroelectric or paraelectric materials for various purposes. Layers of this type can be used as replacements for the dielectric, which normally consists of an oxide or nitride layer, of a storage capacitor of a DRAM (Dynamic Random Access Memory) semiconductor memory. The advantage of these "FeRAMs" is: first the much higher dielectric constant of the ferroelectric material, and second the possibility of fabricating a nonvolatile memory module by the remanent polarization of the ferroelectric material.

Furthermore, in the case of MOS transistors, a ferroelectric layer can be formed as a replacement for the gate oxide layer as an insulating layer between the gate electrode and the channel section of the semiconductor surface, with the result that a nonvolatile memory transistor can be fabricated.

Strontium bismuth tantalate, with a composition $SrBi_2Ta_2O_9$ (SBT) or $SrBi_2(Ta, Nb)_2O_9$ (SBTN) has been known for some time as a ferroelectric material and can be deposited on a substrate, for example, by using a metal organic deposition process (MOCVD, MOD). However, the SBT/SBTN is generally not deposited in the ferroelectric phase, but rather is only converted into the ferroelectric phase by a subsequent heat treatment, known as the ferroanneal, in an oxygen-containing atmosphere. The temperatures required for this heat treatment step according to the methods that have been disclosed hitherto are above 700° C. For this reason, inert electrode materials, such as for example, platinum metals and conductive oxides thereof, have to be used to fabricate storage capacitors from this ferroelectric material.

To build up a DRAM memory cell, there are substantially two different structural concepts. A common feature of the two different structural concepts is that the switching transistor is formed in a lower level directly on the semiconductor substrate and the storage capacitor is arranged in a higher level. The switching transistor and the storage capacitor are separated from one another by an insulation layer that is positioned between them. According to a first structural concept (stacked cell), the switching transistor and the storage capacitor are arranged substantially directly above one another, and the lower electrode of the storage capacitor is electrically connected to the drain region of the MOS transistor by a contact hole (plug) which has been formed in the insulation layer and filled with a conductive material. According to a second structural concept (offset cell), the switching transistor and the storage capacitor are arranged offset with respect to one another, and the upper electrode of the storage capacitor is electrically connected to the drain region of the MOS transistor through two contact holes.

On account of the considerably smaller amount of space required by the "stacked cell" concept, this would under normal circumstances have to be preferred to the "offset cell" concept. However, the difficulty of the former concept is the need to arrange a diffusion barrier between the contact hole that has been filled with polycrystalline silicon or tungsten and the lower electrode, which usually consists of platinum, of the storage capacitor.

FIG. 1 shows a DRAM memory cell which uses the "stacked cell" concept. First of all, a MOS transistor 10 is fabricated on a semiconductor substrate 1 by forming a drain region 11 and a source region 12 by doping. A channel 13 is located between them. The conductivity of this channel can be controlled by a gate 14, which is arranged above the channel 13. The gate 14 may be formed by or connected to a word line of the memory component. The source region 12 is connected to a bit line of the memory component. The MOS transistor 10 is then covered with a planarization insulation layer 15, usually of an oxide such as $SiO_2$. A storage capacitor 20, which substantially includes a lower electrode layer 21, a ferroelectric layer 22 and an upper electrode layer 23, is formed on this insulation layer 15. The lower electrode layer 21 is arranged above a contact hole 30, which is filled with a conductive material, such as polycrystalline silicon, and is connected to the drain region 11 of the switching transistor 10 by this contact hole. Between the lower electrode layer 21 and the contact hole 30 there is a diffusion barrier layer 25, which on the one hand prevents Si material from diffusing out of the contact hole 30 into the ferroelectric layer 22 and on the other hand prevents $Bi/Bi_2O_3$ and oxygen from diffusing out of the ferroelectric layer 22 into the contact hole 30. In particular the latter phenomenon may cause partial oxidation of the silicon of the contact hole 30, so that a nonconductive $SiO_2$ layer is formed. Since the lower electrode layer 21 usually consists of platinum, which has a columnar grain structure, this platinum layer forms only an inadequate barrier to these diffusion phenomena.

Diffusion barriers are often formed from titanium layers or Ti/TiN double layers. However, it is known that these are unable to withstand a process temperature above 700° C., as required in conventional methods for producing the ferroelectric layer 22. Hitherto, there has been no technologically established diffusion barriers which are suitable for such high process temperatures.

SUMMARY OF THE INVENTION

It is accordingly an object of the invention to provide a method for producing ferroelectric strontium bismuth tantalate which overcomes the above-mentioned disadvantages of the prior art methods of this general type.

In particular, it is an object of the present invention to provide a method for producing ferroelectric strontium bismuth tantalite, which can be integrated in a process for fabricating a component, such as a storage capacitor, and does not cause damage to other existing materials. In particular, it is also an object of the present invention to provide a method of this type in which the heat treatment step can be carried out at a lower temperature than that used in the prior art.

With the foregoing and other objects in view there is provided, in accordance with the invention, a method for producing ferroelectric $Sr_xBi_yTa_2O_9$ (SBT) or $Sr_xBi_y(Ta, Nb)_2O_9$ (SBTN). The method includes steps of: depositing $Sr_xBi_yTa_2O_9$ (SBT) or $Sr_xBi_y(Ta, Nb)_2O_9$ (SBTN) on a substrate, where $0.7 \leq x \leq 1$ and $2.1 \leq y \leq 3.0$; and performing a heat treatment step at a temperature $T_1$ being less than 700° C., until the $Sr_xBi_yTa_2O_9$ (SBT) or the $Sr_xBi_y(Ta, Nb)_2O_9$ (SBTN) has adopted a ferroelectric phase.

In accordance with an added feature of the invention, after performing the heat treatment step, which defines a first heat treatment step, performing a second heat treatment step at a temperature $T_2$, where 550° C.$\leq T_2 \leq$ 700° C.; and simultaneously with performing the second heat treatment step, removing bismuth that evaporates from the $Sr_xBi_yTa_2O_9$ (SBT) or the $Sr_xBi_y(Ta, Nb)_2O_9$ (SBTN) during the second heat treatment step by pumping out the bismuth.

In accordance with an additional feature of the invention, when performing the step of depositing the $Sr_xBi_yTa_2O_9$ (SBT) or the $Sr_xBi_y(Ta, Nb)_2O_9$ (SBTN) on the substrate, insuring that $y \geq 2.4$; and when performing the heat treatment step, insuring that $T_1 \leq 660°$ C.

In accordance with another feature of the invention, the method includes insuring that x lies in a range from $0.7 \leq x \leq 0.9$.

In accordance with a further feature of the invention, the method includes insuring that $x=0.85$.

A significant idea of the inventive method consists in depositing the SBT or SBTN material in a nonstochiometric composition, and in particular modifying the nominal composition $SrBi_2Ta_2O_9$ or $SrBi_2(Ta, Nb)_2O_9$ in such a manner that the element bismuth is deposited in a higher amount y. If in particular the strontium content is denoted by x and the bismuth content is denoted by y, the ranges $0.7 \leq x \leq 1.0$ and $2.1 \leq y \leq 3.0$ are provided for the variables x, y. With these content ranges, it is possible, in a subsequent method step, to carry out a heat treatment at a temperature $T_1$ which is lower than 700° C. and in this way to convert the SBT/SBTN material into a ferroelectric phase.

As the bismuth content y increases, the temperature $T_1$ of the heat treatment step required to convert the material into the ferroelectric phase falls. In particular, for a bismuth content $y \geq 2.4$, it is possible to use a temperature $T_1 \leq 660°$ C.

If appropriate, excess bismuth should be expelled from the SBT/SBTN layer by using a second heat treatment step after the ferroelectric phase has been produced. This second heat treatment step can be carried out at a temperature $T_2$ of 550° C. $\leq T_2 \leq$ 700° C. The bismuth that has been expelled from the ferroelectric material is concurrently removed by being pumped out. Bismuth escapes either in its elemental form or as the molecule $Bi_2O_3$. The high vapor pressure of the bismuth in SBT leads to a partial pressure in the surrounding atmosphere. If the vaporized Bi atoms or molecules are continuously removed from the gas phase, the excess Bi in the layer can be effectively reduced. This can be achieved either by lowering the overall pressure, by increasing the process gas flowrate and/or by using a longer conditioning time. The process gases used may be $O_2$, $N_2$, Ar or He, and the pressure preferably lies below 100 torr.

The inventive method also makes it possible to set the strontium content to be lower than 1, since Sr-deficient SBT increases the remanent polarization of the ferroelectric material. The Sr content x can therefore advantageously be set in a range between 0.7 and 0.9, preferably 0.85.

Therefore, with the inventive method, it is possible to incorporate the production of a ferroelectric layer in a compatible way in an overall process for fabricating a complex component. In particular, it is possible to fabricate a ferroelectric storage capacitor by first of all depositing a first electrode layer on a substrate, then producing a ferroelectric SBT or SBTN layer on the first electrode layer using the inventive method and finally to deposit a second electrode layer on the ferroelectric layer. The electrode layers may be produced from a platinum metal, in particular platinum, or an oxide of a platinum metal or another conductive oxide. If appropriate, the electrode layers can also be produced from a conventional electrically conductive material at a sufficiently low temperature $T_1$ of the heat treatment step.

The invention also relates to a method for fabricating a semiconductor memory, in which first of all a switching transistor is formed on a semiconductor substrate, then an insulation layer is applied to the switching transistor, and finally, as described above, a ferroelectric storage capacitor is fabricated on the insulation layer, in such a manner that one of the electrode layers of the storage capacitor is connected to the source region or the drain region of the switching transistor. To fabricate a semiconductor memory in accordance with the "stacked cell" concept, it is possible for a diffusion barrier layer to be introduced between the first electrode layer of the storage capacitor and the insulation layer.

The invention also relates to a method for fabricating a semiconductor transistor, in which first of all source and drain regions are formed in a semiconductor surface on either side of a channel region. Then a ferroelectric SBT or SBTN layer is produced on the semiconductor surface above the channel region using the inventive method for doing so described above, and finally a gate electrode layer is applied to the ferroelectric layer. In addition, a $CeO_2$ or $ZrO_2$ interlayer may be applied to the semiconductor surface above the channel region prior to the production of the ferroelectric layer, and the ferroelectric layer can then be produced on this interlayer.

Other features which are considered as characteristic for the invention are set forth in the appended claims.

Although the invention is illustrated and described herein as embodied in a method for the low-temperature processing of a ferroelectric strontium bismuth tantalate layer, and methods for the fabrication of ferroelectric components using the layer, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
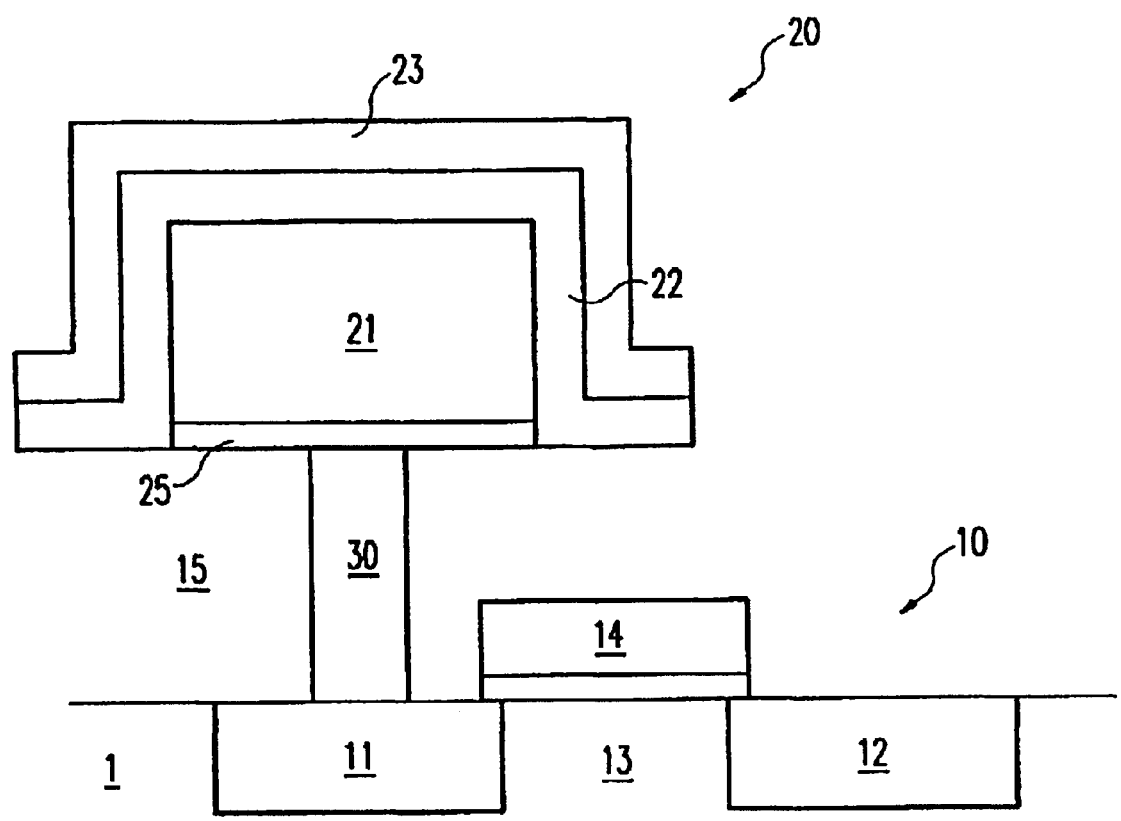
FIG. 1 is a diagrammatic view of a DRAM semiconductor memory constructed in accordance with the "stacked cell" concept.

As has already been explained above with reference to FIG. 1, first of all the switching transistor 10 is formed in the semiconductor substrate 1, and then the structure is planarized with an insulation layer 15. A contact hole 30 is etched into the insulation layer 15 and is filled with polycrystalline silicon. Then, a diffusion layer 25 is applied above the contact hole 30, and a first electrode layer 21 of platinum is applied to the diffusion layer. The diffusion layer 25 and the first electrode layer 21 are jointly patterned. Then, according to the inventive method, a ferroelectric layer 22 is applied to the electrode layer 21 and the diffusion layer 25, completely covering their side walls, and is patterned laterally outside them. Finally, a second electrode layer 23 of platinum is applied to the ferroelectric layer 22, and if appropriate is patterned together with the ferroelectric layer 22.

The fact that a temperature of less than 700° C., if appropriate less than 660° C., can be used for the heat treatment step which is to be carried out on the ferroelectric layer 22 means that it is possible to select a suitable diffusion barrier layer 25 that only has to withstand this lower process temperature. The diffusion barrier layer 25 may, for example, be a titanium layer or a Ti/TiN double layer.

If appropriate, the temperature $T_1$ for the heat treatment step on the ferroelectric layer 22 may be selected to be so low that platinum metals do not necessarily have to be selected for the electrode layers 21 and 23, but rather the latter may, if appropriate, consist of ordinary conductive materials.

Figure 2:
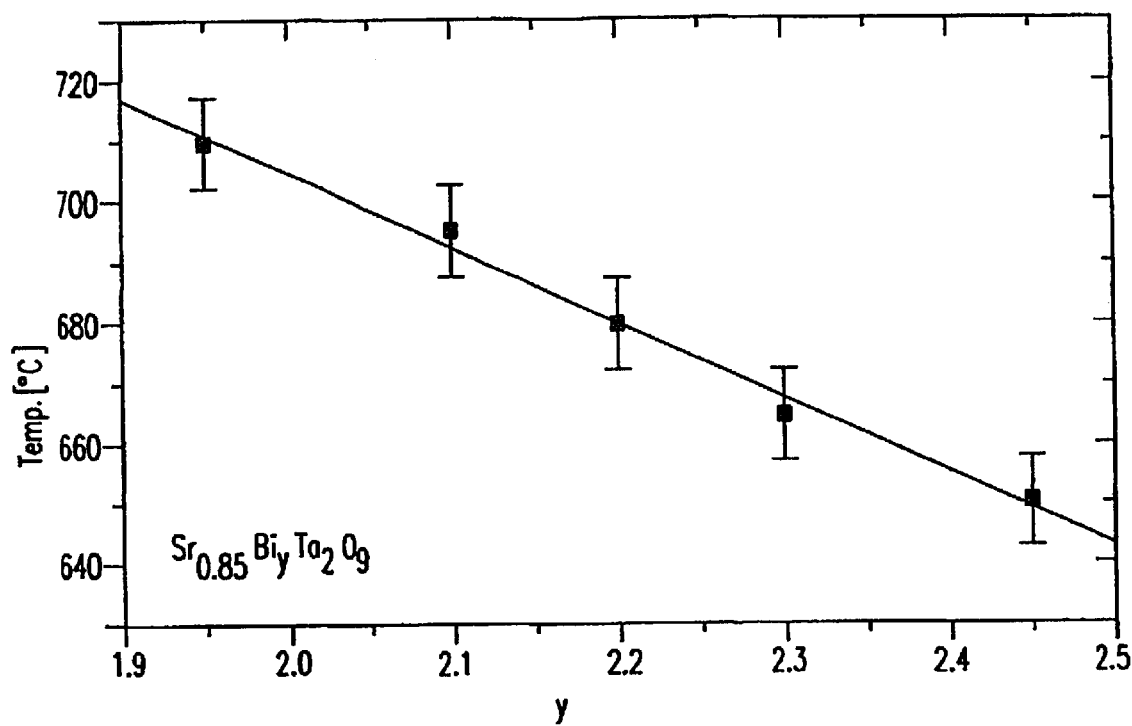
FIG. 2 is a graph showing the functional relationship between the anneal temperature $T_1$ and the bismuth content y.

High-temperature X-ray diffractograms (HTXRDs) have shown that the temperature $T_1$ required for phase transformation into the ferroelectric phase decreases as the bismuth content increases. FIG. 2 shows the way in which this temperature $T_1$ is functionally dependent on the bismuth content y for a strontium content of x=0.85. As can be seen, at y=2.45, a temperature $T_1$=650° C. can be reached. However, if there is too much bismuth in the SBT material, it is segregated to an increased extent at the grain boundaries and toward the two electrodes. Metallic bismuth at the grain boundaries leads to degraded electrical properties and possibly to a short circuit in the capacitor. It is therefore necessary, approximately above a bismuth content y of 2.3, to carry out the second heat treatment step after converting the material into the ferroelectric phase and thereby to expel excess bismuth material.

Figure 3:
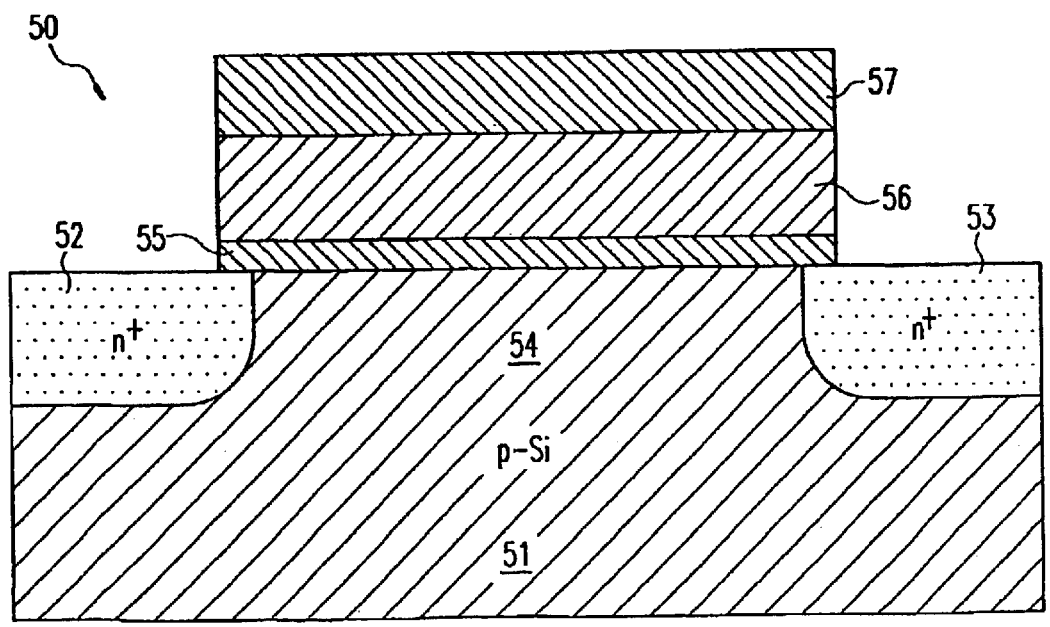
FIG. 3 is a view of a semiconductor transistor that has been fabricated using the inventive method and that has a ferroelectric layer as the gate insulation layer.

Finally, FIG. 3 is a cross sectional view through the drain, gate and source regions of a semiconductor transistor 5, which has been fabricated in accordance with the invention. The n$^+$-doped source and drain regions 52 and 53 are formed in a p-conducting silicon substrate, and a channel region 54 is defined between them. Above the channel region 54, a thin interlayer 55 of $CeO_2$, $ZrO_2$, $Al_2O_3$, $La_2O_3$, $Ta_2O_5$ or zirconium silicate is applied to the semiconductor surface. Then, the ferroelectric layer 56 is deposited on this interlayer 55 using the inventive method and is subjected to a heat treatment process. This is followed by the deposition of the gate electrode 57 on the ferroelectric layer 56, whereupon the layers 55 to 57 are preferably patterned together.

We claim:

1. A method for producing ferroelectric $Sr_xBi_yTa_2O_9$ (SBT) or $Sr_xBi_y$ (Ta, Nb)$_2O_9$ (SBTN), which comprises:

depositing $Sr_xBi_yTa_2O_9$ (SBT) or $Sr_xBi_y$ (Ta, Nb)$_2O_9$ (SBTN) on a substrate, where $0.7 \leq x \leq 1$ and $2.4 \leq y \leq 3.0$; and performing a heat treatment step at a temperature $T_1$ being less than 660° C., until the $Sr_xBi_yTa_2O_9$ (SBT) or the $Sr_xBi_y$(Ta, Nb)$_2O_9$ (SBTN) has adopted a ferroelectric phase.

2. The method according to claim 1, which comprises:

after performing the heat treatment step defining a first heat treatment step, performing a second heat treatment step at a temperature $T_2$, where 550° C.$\leq T_2 \leq$ 700° C.; and simultaneously with performing the second heat treatment step, removing bismuth that evaporates from the $Sr_xBi_yTa_2O_9$ (SBT) or the $Sr_xBi_y$ (Ta, Nb)$_2O_9$ (SBTN) during the second heat treatment step by pumping out the bismuth.

3. The method according to claim 1, which comprises insuring that x lies in a range from $0.7 \leq x \leq 0.9$.

4. The method according to claim 1, which comprises insuring that x=0.85.

5. A method for fabricating a ferroelectric storage capacitor, which comprises:

depositing a first electrode, layer on a substrate;

producing a ferroelectric layer on the first electrode layer by:

depositing $Sr_xBi_yTa_2O_9$ (SBT) or $Sr_xBi_y$ (Ta, Nb) $_2O_9$ (SBTN) on the first electrode layer, where $0.7 \leq x \leq 1$ and $2.4 \leq y \leq 3.0$, and performing a heat treatment step at a temperature $T_1$ being less than 660° C., until the $Sr_xBi_yTa_2O_9$ (SBT) or the $Sr_xBi_y$ (Ta, Nb)$_2O_9$ (SBTN) has adopted a ferroelectric phase; and depositing, a second electrode layer on the ferroelectric layer.

6. The method according to claim 5, wherein the first electrode layer and the second electrode layer each include a platinum metal.

7. The method according to claim 5, wherein the first electrode layer and the second electrode layer each include platinum, an oxide of a platinum metal, or another conductive oxide.

8. A method for producing a semiconductor memory, which comprises:

forming a switching transistor on a semiconductor substrate, the switching transistor having a source region and a drain region;

applying an insulation layer to the switching transistor;

fabricating a ferroelectric storage capacitor on the insulation layer by:

depositing a first electrode layer on the insulation layer, producing a ferroelectric layer on the first electrode layer by: depositing $Sr_xBi_yTa_2O_9$ (SBT) or $Sr_xBi_y$ (Ta, Nb)$_2O_9$ (SBTN) on the first electrode layer, where $0.7 \leq x \leq 1$ and $2.4 \leq y \leq 3.0$, and performing a heat treatment step at a temperature $T_1$ being less than 660° C., until the $Sr_xBi_yTa_2O_9$ (SBT) or the $Sr_xBi_y$ (Ta, Nb)$_2O_9$ (SBTN) has adopted a ferroelectric phase, and depositing a second electrode layer on the ferroelectric layer; and performing the step of fabricating the ferroelectric storage capacitor on the insulation layer such that the first electrode layer or the second electrode layer is connected to the source region of the switching transistor or the drain region of the switching transistor.

9. The method according to claim 8, wherein the first electrode layer and the second electrode layer each include a platinum metal.

10. The method according to claim 8, wherein the first electrode layer and the second electrode layer each include platinum, an oxide of a platinum metal, or another conductive oxide.

11. A method for fabricating a semiconductor transistor, which comprises:

forming a source region in a surface of a semiconductor substrate on one side of a channel region and forming a drain region in the surface of the semiconductor substrate on another side of the channel region, producing a ferroelectric layer on the surface of the semiconductor substrate above the channel region by: depositing $Sr_xBi_yTa_2O_9$ (SBT) or $Sr_xBi_y(Ta, Nb)_2O_9$ (SBTN) on the surface of the semiconductor substrate, where $0.7 \leq x \leq 1$ and $2.4 \leq y \leq 3.0$, and performing a heat treatment step at a temperature $T_1$ being less than 660° C., until the $Sr_xBi_yTa_2O_9$ (SBT) or the $Sr_xBi_y(Ta, Nb)_2O_9$ (SBTN) has adopted a ferroelectric phase; and applying a gate electrode layer to the ferroelectric layer.

12. The method according to claim 11, which comprises:

before performing the step of producing the ferroelectric layer, applying a $CeO_2$ or $ZrO_2$ interlayer to the surface of the semiconductor substrate above the channel region; and when performing the step of producing the ferroelectric layer, producing the ferroelectric layer on the interlayer.

* * * * *